United States Patent

Suzuki et al.

[11] Patent Number: 5,854,505
[45] Date of Patent: Dec. 29, 1998

[54] PROCESS FOR FORMING SILICON OXIDE FILM AND GATE OXIDE FILM FOR MOS TRANSISTORS

[75] Inventors: Atsushi Suzuki; Akihide Kashiwagi; Kazuhiko Tokunaga; Toshihiko Suzuki, all of Kanagawa, Japan

[73] Assignee: Sony Corporation, Japan

[21] Appl. No.: 804,957

[22] Filed: Feb. 24, 1997

Related U.S. Application Data

[60] Continuation of Ser. No. 599,157, Feb. 9, 1996, abandoned, which is a division of Ser. No. 172,167, Dec. 23, 1993, Pat. No. 5,506,178.

[30] Foreign Application Priority Data

Dec. 25, 1992 [JP] Japan .................................. 4-357895
Mar. 23, 1993 [JP] Japan .................................. 5-086836
Oct. 22, 1993 [JP] Japan .................................. 5-287494

[51] Int. Cl.$^6$ .................................................. H01L 29/76
[52] U.S. Cl. .......................................... 257/410; 257/411
[58] Field of Search .................................. 257/288, 410, 257/411; 437/239

[56] References Cited

U.S. PATENT DOCUMENTS

| | | | |
|---|---|---|---|
| 4,007,294 | 2/1977 | Woods et al. | 257/410 |
| 4,518,630 | 5/1985 | Grasser | 257/410 |
| 5,172,203 | 12/1992 | Hayashi | 257/66 |
| 5,506,178 | 4/1996 | Suzuki et al. | 437/239 |

OTHER PUBLICATIONS

IEEE Electron Devices Letters, vol. 11, No. 1, Jan. 1990, pp. 3–5 by MacWilliams et al.

*Primary Examiner*—Mark V. Prenty
*Attorney, Agent, or Firm*—Ronald P. Kananen

[57] ABSTRACT

A process for forming a silicon oxide film comprising:

(a) heat treating a semiconductor substrate at a temperature of 1,150° C. or higher under a 100% hydrogen gas atmosphere for a period of 10 to 600 minutes; and (b) forming a silicon oxide film on the semiconductor substrate by wet oxidation, followed by heat treating said silicon oxide film under an inert gas atmosphere containing a halogen element.

6 Claims, 6 Drawing Sheets

Fig.5
(Evaluation of TZDB characteristics)
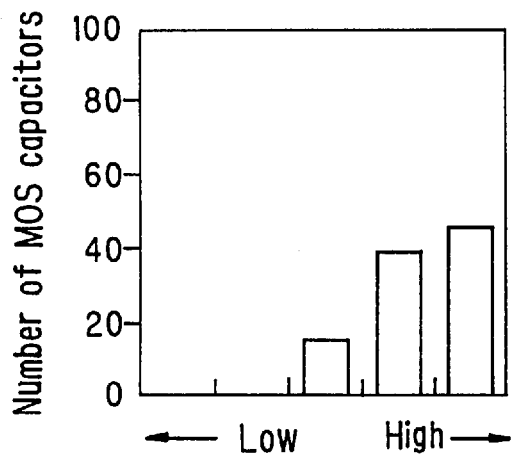
(Example)
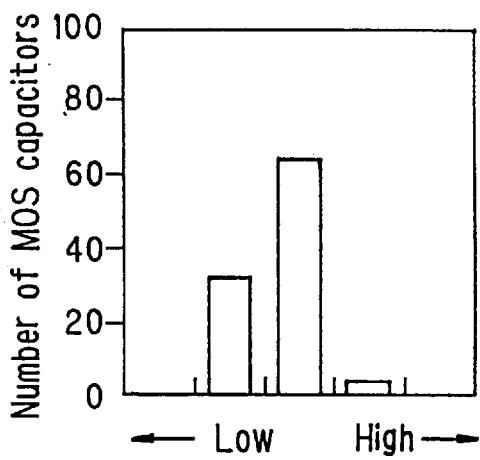
Comp-(Example 1)
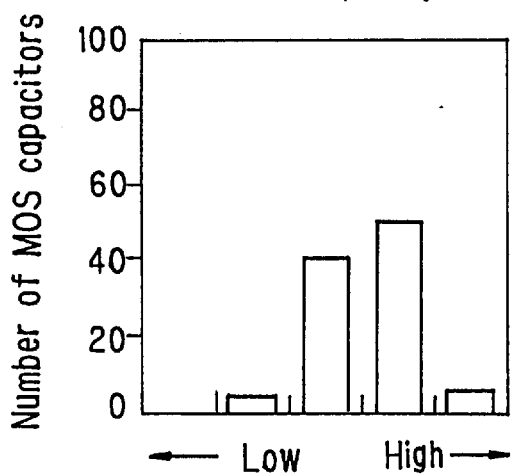
Comp-(Example 2)
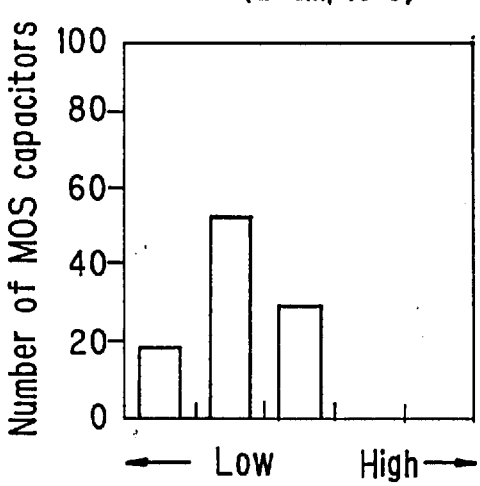
Comp-(Example 3)

PROCESS FOR FORMING SILICON OXIDE FILM AND GATE OXIDE FILM FOR MOS TRANSISTORS

This application is a continuation of application Ser. No. 08/599,157 filed Feb. 9, 1996 now abandoned, which is a divisional application of Ser. No. 08/172,167 filed on Dec. 23. 1993, now U.S. Pat. No. 5,506,178, issued Apr. 9, 1996, currently entitled PROCESS FOR FORMING SILICON OXIDE FILM AND GATE OXIDE FILM FOR MOS TRANSISTORS.

BACKGROUND OF THE INVENTION

1. Industrial Field of the Invention

The present invention relates to a process for forming a silicon oxide film ($SiO_2$ film) on a semiconductor substrate.

2. Prior Art

In the fabrication of a MOS (metal oxide semiconductor) semiconductor device, it is essential to form a gate oxide film by oxidation. The properties of a gate oxide film are greatly influenced by the atmosphere under which the film is formed. Accordingly, an oxide film can be deposited by processes differing from each other in atmospheric conditions. For instance, a silicon oxide film can be deposited by any of the processes belonging to, for example, dry oxidation and wet oxidation. The dry oxidation process comprises supplying a sufficiently dried high purity oxygen to the surface of a hot silicon substrate. In this manner, a silicon oxide film can be formed on the surface of the silicon substrate. The wet oxidation process comprises supplying, to the surface of a silicon substrate, a hot carrier gas containing water vapor. Thus, this process also provides a silicon oxide film on the surface of the silicon substrate.

A pyrogenic oxidation is one of the wet oxidation processes. This method is characterized in that pure hydrogen is combusted to generate water. Accordingly, a highly reproducible oxidation can be effected without controlling water flow. With respect to hot carrier resistance of the silicon film, a film obtained by this method is inferior to one obtained by a dry oxidation process. This is because a film obtained by pyrogenic oxidation contains a large amount of electron traps attributed to water. However, the pyrogenic oxidation process is far superior to the dry oxidation process considering the insulator breakdown voltage and the long-term reliability of the silicon oxide film. It is also reported that pyrogenic oxidation is employed in the fabrication of flash memories, i.e., novel types of memory whose production is expected to increase.

On the other hand, it is known that a dry oxidation method comprising forming a silicon oxide film under an oxidizing atmosphere based on a compound containing chlorine (e.g., $HCl$, $Cl_2$, $CCl_4$, $C_2HCl_3$, $CH_2Cl_2$, and $C_2H_3Cl_3$) or a compound containing a halogen atom other than chlorine provides a silicon oxide film which yields the following advantageous effects (this method is hereinafter referred to as "hydrochloric acid oxidation method"):

(A) neutralization or gettering of alkali metal impurities incorporated in the silicon oxide film;
(B) reduction of stacking defects;
(C) improvement in time-zero dielectric breakdown (hereinafter abbreviated and referred to as "TZDB"), i.e., an index for evaluating the resistance against dielectric breakdown in a short period of time; and
(D) improvement of channel mobility.

It is also well-established that, by heating the silicon oxide film once formed on a silicon substrate in the temperature range of from 800° to 1,000° C. under an atmosphere of an inert gas such as nitrogen and argon for a duration of about 30 minutes, the following effects attributed to the favorable interface between the silicon oxide film and the silicon substrate can be obtained:

(E) reduction of fixed charge; and
(F) reduction of the density of states (interface levels).

Time dependent dielectric breakdown (hereinafter abbreviated and referred to as "TDDB") provides an index for evaluating the long-term reliability of a silicon oxide film. The TDDB does not occur immediately at the instant an electric current stress or a voltage stress is applied; the breakdown occurs on the silicon oxide film only after time passes for a certain period from the point the stress is applied.

A silicon oxide film formed by the wet oxidation process yields superior TDDB characteristics as compared with a one obtained by the dry oxidation process. This signifies that the wet oxidation process provides silicon oxide films having superior long-term reliability. It is believed that the reason for this is attributed to the presence of hydroxyl groups (—OH) and silanol groups ($—SiOH_x$) within the silicon oxide film, which contribute to the improvement of the TDDB characteristics.

The hydrochloric acid oxidation process, which is a type of dry oxidation process, yields silicon oxide films having improved TZDB characteristics. However, no improvement can be observed on the TDDB characteristics of the films obtained by this process. Furthermore, the hydrochloric acid oxidation process requires strict control of the apparatus and the conditions for forming the oxide film.

As described in the foregoing, a silicon oxide film obtained by a wet oxidation process has excellent TDDB characteristics. By further heat-treating the silicon oxide film obtained by this method under an inert gas such as nitrogen and argon, improvements concerning the reduction of fixed charges and of the density of states (refer to the points (E) and (F) enumerated above) can be certainly achieved. However, the TZDB characteristics of the silicon oxide films are still inferior to those obtained by hydrochloric acid oxidation process.

Furthermore, for instance, JP-A-3-219632 (the term "JP-A-" signifies an "unexamined Japanese patent publication", hereinafter) discloses a process for forming an insulator film, which is characterized by thermally treating an already formed insulator film under a reactive gas atmosphere containing, for example, chlorine. According to this process, the insulator film is formed by rapidly heating the substrate using an infrared-emitting lamp. That is, from a broader viewpoint, the insulator film is formed by a dry oxidation process. Accordingly, the TDDB characteristics of the silicon oxide film obtained by this process are still inferior to that of the film formed by a wet oxidation process. An object of the proposed method is to reduce the defects ascribed to dangling bonds and the like which are formed during the formation of the film. It can be seen that the process disclosed in this patent publication is not intended to improve the TZDB or the TDDB characteristics of the oxide film. Furthermore, the disclosed process comprises effecting the heat-treatment by a so-called RTA (rapid thermal annealing) at 1,000° C. for a duration of 20 seconds to form an $SiCl_x$ doping layer in the vicinity of the interface between the insulator film and the substrate.

It can be seen from the foregoing that any of the conventional dry oxidation processes and wet oxidation processes fail to provide a silicon oxide film which satisfies both demands as to both TZDB and TDDB characteristics.

The present applicants proposed, in Japanese patent application Hei-5-86836 (filed on Mar. 23rd, 1993), a process for forming a silicon oxide film having satisfactory characteristics concerning both TZDB and TDDB. The process disclosed in this application is certainly effective; however, some problems, which are explained below, are yet to be solved.

The characteristics of a gate oxide film are influenced not only by the atmospheric conditions under which the film is formed, but also by the nature of the underlying semiconductor substrate. More specifically, minute defects such as stacking defects and oxygen precipitates in the substrate are the factors which deteriorate the quality of the gate oxide film. The problem concerning the minute defects has been coped with by heat treating the substrate at a high temperature, i.e., by forming a denuded zone. The denuded zone is a defect-free layer formed by externally diffusing the oversaturated oxygen. However, with further progress in the technology, it has been found that Czochralski(CZ)-grown silicon wafers used in the present-day fabrication of MOS semiconductor devices contain, in addition to various types of minute defects induced during the heat treatment of the process, residual defects which are formed during the crystal growth of the single crystal. Since those defects remain at a density of from $10^5$ to $10^6/cm^3$ even after a heat treatment at a relatively high temperature, they cause deterioration of the film and lower the withstand voltage when they are taken into the gate oxide film. Thus, those defects further increases the B-mode failure in the TZDB characteristics.

It is known that the use of a semiconductor substrate fabricated from CZ-grown single crystals pulled up at a low rate or an epitaxially grown semiconductor substrate improves the breakdown withstand voltage characteristics of the silicon oxide thin film formed thereon. However, the fabrication cost of such substrates are high. Moreover, the semiconductor substrates fabricated from a single crystal pulled up at a low rate tend to be influenced by the heat treatment performed during the fabrication of the semiconductor device. Accordingly, the practical effect concerning the use of such a substrate is still questioned.

SUMMARY OF THE INVENTION

An object of the present invention is, accordingly, to provide a process for fabricating a silicon oxide film improved in both TZDB and TDDB characteristics, and also capable of reducing the defects incorporated in the region of the semiconductor substrate on which the silicon oxide is formed. Another object of the present invention is to provide a gate oxide film for a MOS transistor by a process based on the first embodiment according to the present invention.

The above object according to the present invention can be accomplished by forming a silicon oxide film according to the process of the present invention, which comprises:

heat treating a semiconductor substrate at a temperature of 1,150° C. or higher under an atmosphere of 100% hydrogen gas; and forming a silicon oxide film on the semiconductor substrate by wet oxidation, followed by heat treating the silicon oxide film under an inert gas atmosphere containing a halogen element.

BRIEF DESCRIPTION OF THE DRAWINGS

FIGS. 1(A)–1l(C) are a schematically drawn partial cross section of step-sequential structures comprising a semiconductor substrate, provided as an explanatory means for showing the process for forming a silicon oxide film according to the present invention;

FIG. 5 is a bar graph showing the distribution of dielectric breakdown voltage obtained in the evaluation of the time-zero dielectric breakdown (TZDB) characteristics of each of the silicon oxide films formed in the Example according to the present invention and in Comparative Examples 1 to 3;

DETAILED DESCRIPTION OF THE PRESENT INVENTION

Figure 1A:
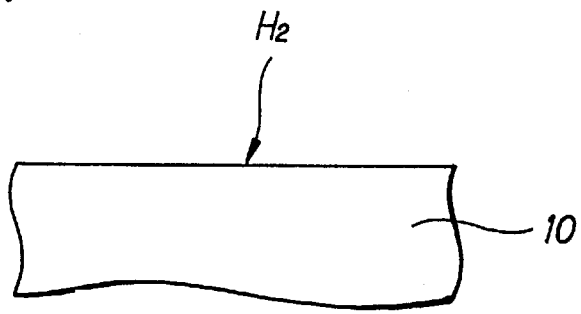

The process according to the first embodiment of the present invention comprises a first step of heat treating a semiconductor substrate at a temperature not lower than 1,150° C. If this step is conducted at a temperature lower than 1,150° C., no improvements in substrate quality can be expected. This is explained in further detail hereinafter. The temperature of the heat treatment is preferably as high as possible; accordingly, the maximum temperature for the heat treatment depends on the melting point of the semiconductor substrate and the highest allowable temperature of the heat treatment apparatus. The duration of the heat treatment is about 10 to 600 minutes.

The semiconductor substrate is preferably prepared by Czochralski (CZ) method or by magnetic field-applied Czochralski (MCZ) method.

Preferably, pyrogenic oxidation process is employed among the wet oxidation processes. The halogen element to be used therein may be chlorine, bromine, or fluorine; best preferred among them is chlorine. The halogen elements are incorporated in the inert gas in the form of, for example, HCl, $CCl_4$, $C_2HCl_3$, $Cl_2$, HBr, and $NF_3$. The content of the halogen atoms in the inert gas is from 0.001 to 10% by volume, preferably from 0.005 to 10% by volume, and most preferably, from 0.02 to 10% by volume, based on the as used form, i.e., as a molecule or compound enumerated above. If hydrochloric gas is used, for instance, it preferably accounts for from 0.02 to 10% by volume of the entire inert gas.

The process according to the first embodiment of the present invention further comprises a second heat treatment, which is preferably a furnace annealing treatment. This heat treatment is preferably performed at a temperature in the range of from 800° to 1,200° C., preferably in the range of from 800° to 1,000° C., and most preferably in the range of from 800° to 900 ° C. The duration of the heat treatment is from 5 to 60 minutes, preferably from 10 to 40 minutes, and most preferably, from 20 to 30 minutes. Inert gases used in this step include nitrogen and argon.

The MOS transistor according to the second embodiment of the present invention comprises a silicon oxide film formed by the process according to the first embodiment of the present invention as described above.

The process for forming a silicon oxide film according to the first embodiment of the present invention is characterized in that the semiconductor substrate is heat treated under a 100% hydrogen gas atmosphere at a temperature not lower than 1,150° C. In this manner, the residual defects which form during the crystal growth of the single crystal as silicon oxide precipitates undergo decomposition by the reduction reaction with hydrogen on the surface layer portion of the semiconductor substrate. At the same time, external diffusion of the oversaturated oxygen can be effected. As a result, the formation of oxygen precipitates in the heat treatment step during the fabrication process of the semiconductor device can be suppressed. More specifically, for example, a semiconductor substrate obtained from a CZ- or MCZ-grown wafer is subjected to the aforementioned treatment under hydrogen atmosphere, a region ranging from the surface to a depth of about several tens of micrometers ($\mu$m) can be kept completely defect free, or almost defect-free through the entire fabrication process inclusive of the step of forming the gate oxide film. Thus, the degradation of the film quality (e.g., lowering of breakdown withstand voltage) ascribed to the defects in the semiconductor substrate can be prevented from occurring.

Furthermore, since the silicon oxide film according to the present invention is formed by wet oxidation, the resulting silicon oxide film is superior in time-dependent dielectric breakdown (TDDB) characteristics. Moreover, the silicon oxide film according to the present invention provides excellent time-zero dielectric breakdown (TZDB) characteristics because the silicon oxide film is heat treated under an inert gas atmosphere containing a halogen element.

The present invention is illustrated in greater detail referring to non-limiting examples below. It should be understood, however, that the present invention is not to be construed as being limited thereto.

EXAMPLE

Figure 1B:
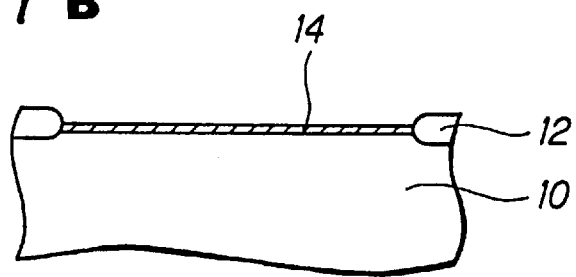
Figure 1C:
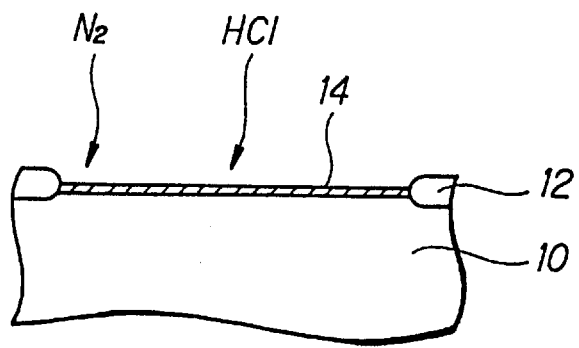
Figure 2:
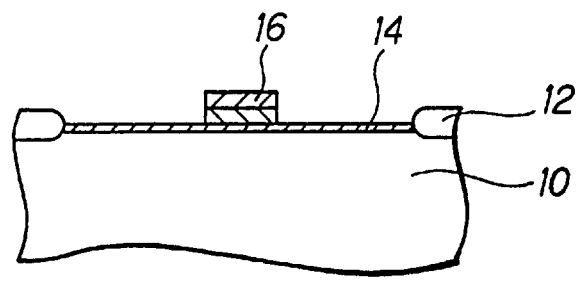
FIGS. 2(A)–2(B) are a schematically drawn partial cross section of step-sequential structures which follow the structures shown in FIG. 1, provided as an explanatory means for showing the process for fabricating a MOS transistor according to the present invention.
Figure 2:
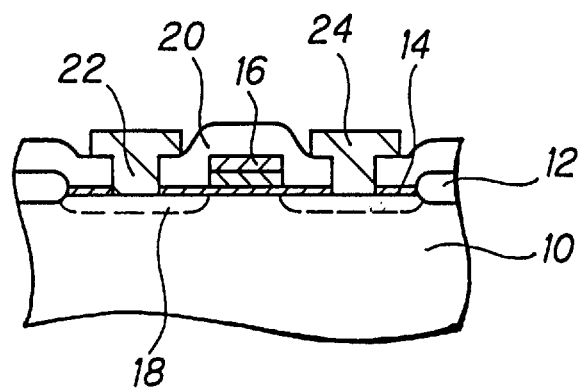

Referring to FIGS. 1 and 2, the process for forming a silicon oxide film according to the present invention is described in detail below.

A semiconductor substrate 10 containing oxygen at a concentration of $1.45 \times 10^{18}$ atoms/cm$^3$ (according to ASTM F121-1979) and having a substrate resistivity of 100 $\Omega$·cm, made from a (100)-plane CZ-grown silicon mirror-finished wafer was subjected to a heat treatment at 1,200° C. under 100% hydrogen atmosphere for a duration of 1 hour (see FIG. 1(A)).

Element isolation regions 12 were formed on the resulting semiconductor substrate thereafter according on a conventional process.

A 10 nm thick silicon oxide film 14 was formed on the surface of the semiconductor substrate using one of the wet oxidation processes, i.e., the conventional pyrogenic oxidation process (see FIG. 1(B)). The pyrogenic oxidation can be performed, for example, while controlling the substrate temperature to 850° C. If necessary, the surface of the semiconductor substrate is cleaned before the formation of the silicon oxide film 14, by using, for example, chemicals and pure water.

The silicon oxide film 14 was then heat treated under an inert gas atmosphere containing a halogen element (see FIG. 1(C)). More specifically, the silicon oxide film 14 was heat-treated using a furnace apparatus at 850° C. for a duration of 30 minutes under a nitrogen gas atmosphere containing 0.1% by volume of hydrochloric gas. A halogen-rich layer is expected to develop in the vicinity of the surface of the silicon oxide film 14 during this step. A silicon oxide film 14 for use as a gate oxide film of MOS transistors can be formed in this manner.

Subsequently, a polysilicide gate electrode 16 comprising polysilicon and tungsten silicide was formed on the silicon oxide film 14 using a known CVD (chemical vapor deposition) technology, photolithography, and dry etching. Thus was obtained a MOS capacitor (see FIG. 2(A)).

After forming source-drain region 18 in the semiconductor substrate 10 by ion implantation, an interlayer insulator layer 20 was deposited over the entire surface of the structure using a known CVD technology. An opening 22 was formed thereafter in the interlayer insulator layer 20 using photolithography and dry etching technologies. Subsequently, an interconnection layer of, for example, an aluminum alloy, was deposited, using sputtering process or the like, over the interlayer insulator layer inclusive of the inside of the opening 22. The resulting interconnection layer was patterned by photolithography and dry etching technologies to form an interconnection 24 (see FIG. 2(B)). Thus was the structure finished into a MOS transistor.

COMPARATIVE EXAMPLE 1

A silicon oxide film was formed by a process similar to that used in Example, except that the semiconductor substrate 10 was not subjected to heat treatment under a hydrogen gas atmosphere. A silicon oxide film 14 was deposited on the semiconductor substrate 10, and was heat treated in the same manner as in Example above.

COMPARATIVE EXAMPLE 2

A silicon oxide film was formed by a process similar to that used in Example, except that the silicon oxide film 14 was subjected to heat treatment under an inert gas atmosphere containing no halogen elements, i.e., under a nitrogen gas atmosphere. The semiconductor substrate 10 was heat treated under a hydrogen gas atmosphere, and the silicon oxide film 14 was deposited on the semiconductor substrate 10 in the same manner as in Example above.

COMPARATIVE EXAMPLE 3

A silicon oxide film was formed by a process similar to that used in Example, except that the semiconductor substrate 10 was not subjected to heat treatment under a hydrogen gas atmosphere, and that the silicon oxide film 14 was heat treated under an inert gas atmosphere containing no halogen elements, i.e., under a nitrogen gas atmosphere. The silicon oxide film 14 was deposited on the semiconductor substrate 10 in the same manner as in Example above.

COMPARATIVE EXAMPLE 4

A silicon oxide film was formed by a process similar to that used in Comparative Example 1. In the present case, however, a single crystal silicon prepared by Czochralski method under a lower pulling up rate, i.e., at a pulling up rate about the half of the ordinary rate, was used.

COMPARATIVE EXAMPLE 5

A silicon oxide film was formed by a process similar to that used in Comparative Example 3, except for using the same semiconductor substrate as that employed in Comparative Example 4.

Figure 3:
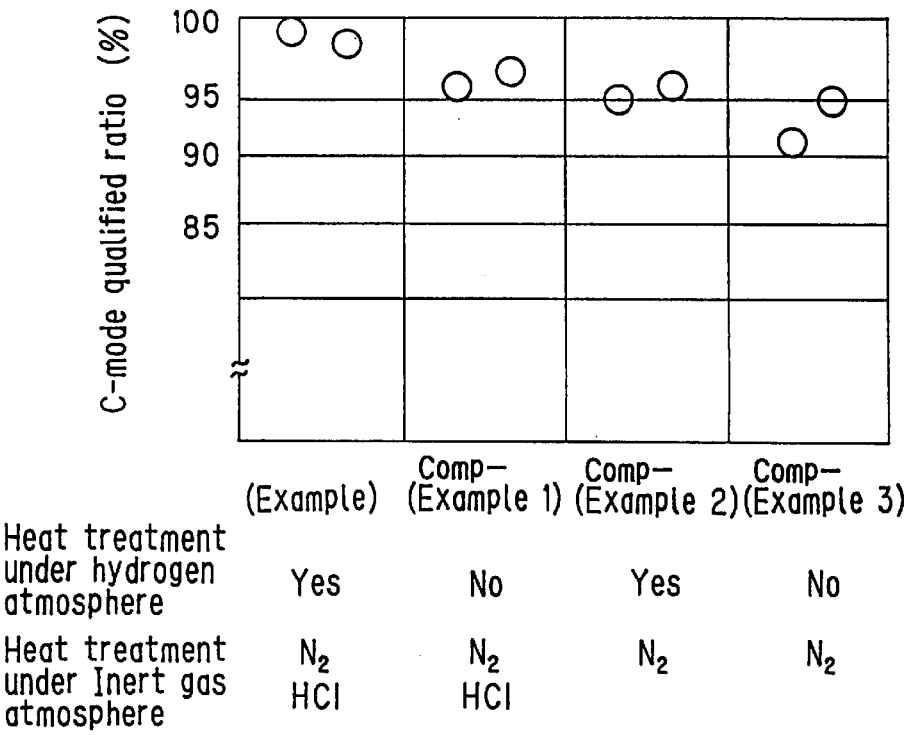
FIG. 3 is a graph showing the results obtained in the evaluation of the time-zero dielectric breakdown (TZDB) characteristics of each of the silicon oxide films formed in the Example according to the present invention and in Comparative Examples 1 to 3.

FIG. 3 shows the TZDB characteristics of the silicon oxide films thus obtained as gate oxide films of MOS capacitors in the Example and Comparative Examples 1 to 3.

Figure 4:
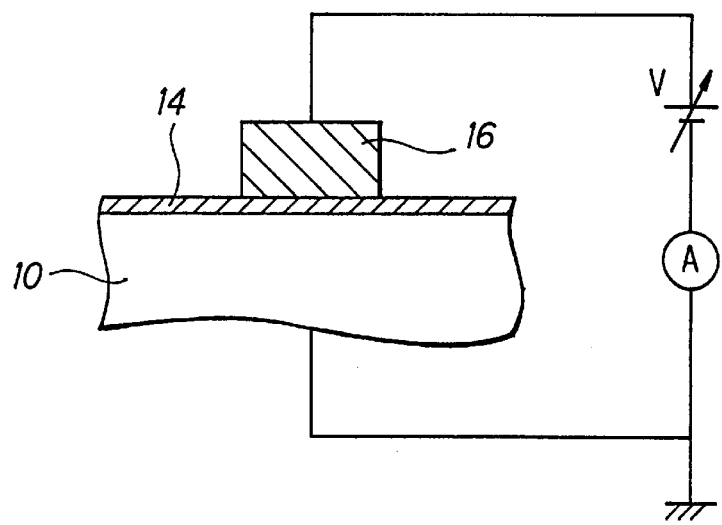
FIG. 4 is a schematically drawn circuit used in the evaluation of time-zero dielectric breakdown (TZDB) characteristics.

The TZDB characteristics of the films above were evaluated according to the following method. One hundred MOS capacitors were formed on a single semiconductor substrate 10. The gate electrodes 16 formed on the gate oxide film (silicon oxide film 14) were each 5 $mm_2$ in area. Two semiconductor substrates were used for the evaluation. A circuit as shown schematically in FIG. 4 was formed, and the current I in the circuit was measured while increasing the voltage V applied to the gate electrode 16. The voltage $V_J$ at the point the current attained the judging current $I_J$, which equals 0.1 μA, was measured, and the $V_J$ thus obtained was reduced to the applied electric field. In this manner, the number of MOS capacitors which yield an applied electric field exceeding 8 MV/cm was obtained and expressed in percentage. Thus was obtained the number fraction of the so-called C-mode qualified products. The results are illustrated in FIG. 3.

FIG. 3 reads that the MOS capacitors obtained in Example yield the highest C-mode qualified ratio.

Figure 6:
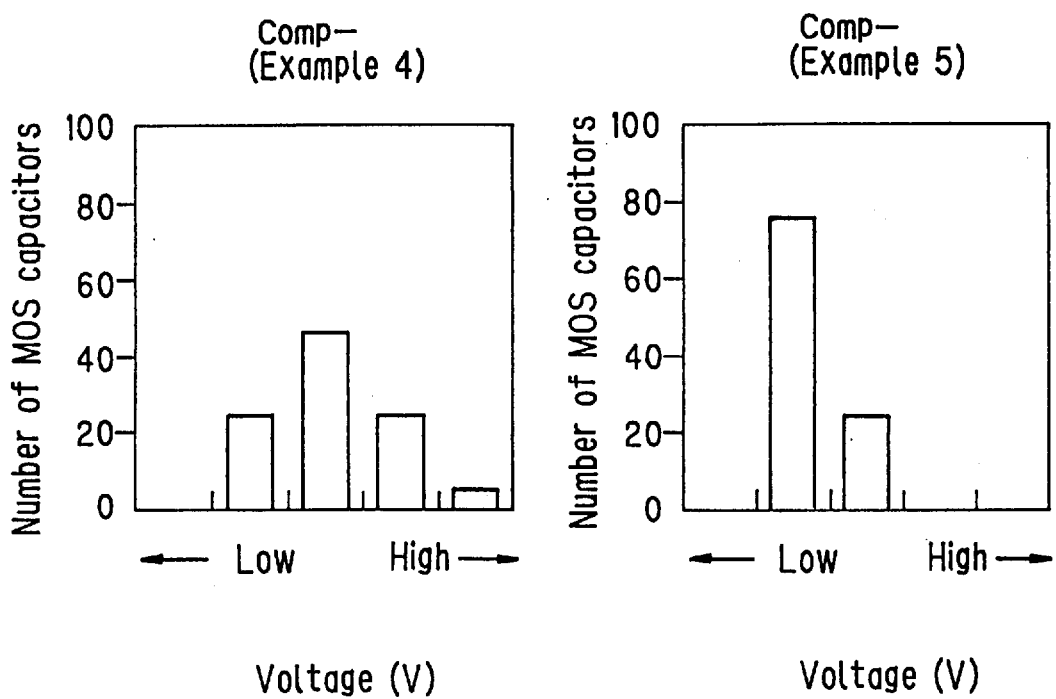
FIG. 6 is a bar graph showing the distribution of dielectric breakdown voltage obtained in the evaluation of the time-zero dielectric breakdown (TZDB) characteristics of each of the silicon oxide films formed according to Comparative Examples 4 and 5.

The distribution of dielectric breakdown voltage obtained in the evaluation of TZDB characteristics of the MOS capacitors obtained in the Example and Comparative Examples 1 to 5 is shown in FIGS. 5 and 6. The dielectric breakdown voltage of the MOS capacitors obtained in the Example are distributed in the highest, thereby indicating the superiority of the gate oxide film (silicon oxide film) obtained in the Example.

Figure 7:
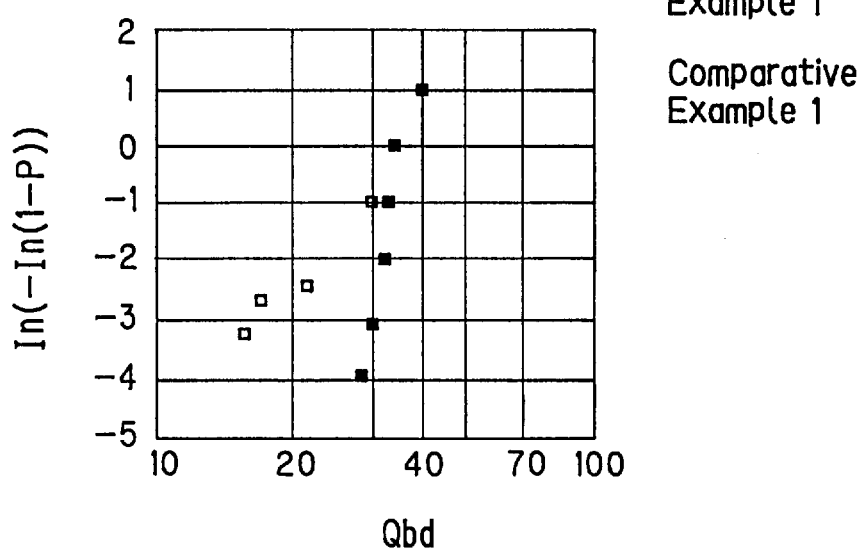
FIG. 7 is a graph showing the results obtained in the evaluation of the time-dependent dielectric breakdown (TDDB) characteristics of each of the silicon oxide films formed in the Example according to the present invention and in Comparative Example 1.

The TDDB characteristics of the MOS capacitors obtained in the Example and Comparative Example 1 is illustrated in FIG. 7.

Figure 8:
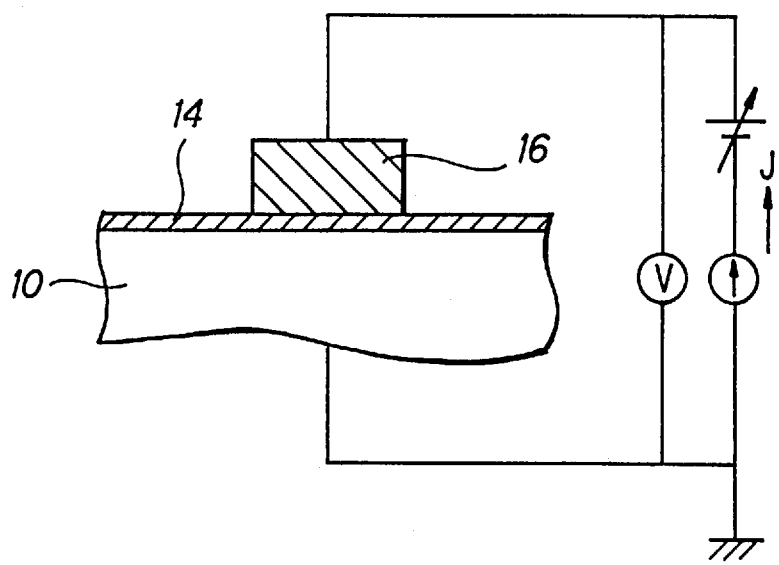
FIG. 8 is a schematically drawn circuit used in the evaluation of time-dependent dielectric breakdown (TDDB) characteristics.

The TDDB characteristics were evaluated according to the following method. Fifty MOS capacitors were fabricated on a single semiconductor substrate 10. The gate electrodes 16 formed on the gate oxide film (silicon oxide film 14) were each 0.1 $mm_2$ in area. Two semiconductor substrates were used for the evaluation. A circuit as shown schematically in FIG. 8 was formed, and the so-called Coulomb breakdown ($Q_{BD}$) was measured by using a constant current stress method which comprises applying a constant current (J=0.2 [A/cm$^2$]) stress to the gate electrode 16, where $Q_{BD}$ is expressed by the product of the constant current (J [A/cm$^2$]) and the time elapsed before dielectric breakdown ($t_{BD}$). FIG. 7 shows the Weibull plot for the cumulative number of defective products (P) against the Coulomb breakdown ($Q_{BD}$).

It can be seen clearly in FIG. 7 that, the TDDB characteristics of the gate oxide film (silicon oxide film) obtained in the Example are superior to those of the gate oxide film (silicon oxide film) obtained in Comparative Example 1. This signifies that a thermal treatment of semiconductor substrates at 1,150° C. or at a higher temperature under a 100% hydrogen gas atmosphere yields substrates further improved in TDDB characteristics.

Thus, the present invention was described in the foregoing referring to a preferred embodiment. However, it should be noted that the present invention is not limited to the Example above, and other modifications can be incorporated in the process. For example, a conventional wet oxidation comprising using water vapor mixed with a carrier gas such as oxygen, nitrogen, and argon, or such comprising using dry oxygen passed through a water bubbler may be employed. Furthermore, the details are to be modified according to the individual case; the conditions for the pyrogenic oxidation and for the heat treatment indicated above can be changed as desired, any inert gas can be used, and any halogen element may be used in a desired form.

The silicon oxide film may be a monolayer or may by multilayered. When a silicon oxide film composed of a plurality of layers is to be formed, the silicon oxide layer formed directly on the surface of the semiconductor substrate must be formed by the process for forming the silicon oxide film according to the present invention. The rest of the layers may be formed by a conventional oxidation process, for example, a dry oxidation process inclusive of hydrochloric acid oxidation, a pressurized oxidation process, a partial pressure oxidation process, a dilution oxidation process, a low temperature oxidation process, and an RTP (rapid thermal treatment oxidation) process.

The process for forming a silicon oxide film according to the present invention provides silicon oxide films having far improved time-zero dielectric breakdown (TZDB) and time-dependent dielectric breakdown (TDDB) characteristics as compared with those of the silicon oxide films obtained by the conventional wet oxidation process or the silicon oxide films proposed in Japanese patent application Hei-5-86836. Furthermore, the process allows the silicon film to be formed by a conventional wet oxidation process which does not require such a strict control of the oxidizing conditions as are necessary in hydrochloric acid oxidation.

While the invention has been described in detail and with reference to specific embodiments thereof, it will be apparent to one skilled in the art that various changes and modifications can be made therein without departing from the spirit and scope thereof.

What is claimed:

1. A gate oxide film of a MOS transistor, which comprises a silicon oxide film formed by a process for forming a silicon oxide film comprising:

(a) forming a silicon oxide film on a semiconductor substrate by wet oxidation; and (b) subjecting the silicon oxide film to heat treatment under an inert gas atmosphere containing a halogen element;

wherein a pyrogenic oxidation process is used as the wet oxidation process; and wherein the halogen element is chlorine.

2. A film formed by the process as claimed in claim 1, wherein said process further comprises heat treating said semiconductor substrate at a temperature of 1,150° C. or higher under a 100% hydrogen gas atmosphere for a period of 10 to 600 minutes, wherein said heat treating is performed prior to said forming a silicon oxide film.

3. A film formed by the process as claimed in claim 1, wherein said process further comprises furnace annealing.

4. A film formed by the process as claimed in claim 1, wherein said chlorine is used in the form of hydrochloric acid, and the inert gas atmosphere contains hydrochloric acid at a concentration of from 0.02 to 10% by volume.

5. A film formed by the process as claimed in claim 3, wherein said furnace annealing is performed in the temperature range of from 800° to 900° C.

6. A film formed by the process as claimed in claim 1, wherein a semiconductor substrate fabricated from a single crystal obtained by a Czochralski method or a magnetic-field-applied Czochralski method is used as the semiconductor substrate.

* * * * *